United States Patent
Park et al.

(10) Patent No.: US 11,149,234 B2
(45) Date of Patent: Oct. 19, 2021

(54) CLEANING COMPOSITION, CLEANING APPARATUS, AND METHOD OF FABRICATING SEMICONDUCTOR DEVICE USING THE SAME

(71) Applicants: Samsung Electronics Co., Ltd., Suwon-si (KR); SEMES Co., Ltd., Cheonan-si (KR)

(72) Inventors: Mi Hyun Park, Seongnam-si (KR); Jung-Min Oh, Incheon (KR); Young-Hoo Kim, Yongin-si (KR); Hyo San Lee, Hwaseong-si (KR); Tae Keun Kim, Cheonan-si (KR); Ye Rim Yeon, Hwaseong-si (KR); Hae Rim Oh, Cheonan-si (KR); Ji Soo Jeong, Seoul (KR); Min Hee Cho, Hwaseong-si (KR)

(73) Assignees: Samsung Electronics Co., Ltd., Suwon-Si (KR); Semes Co., Ltd., Cheoman-Si (KR)

(*) Notice: Subject to any disclaimer, the term of this patent is extended or adjusted under 35 U.S.C. 154(b) by 126 days.

(21) Appl. No.: 16/250,069

(22) Filed: Jan. 17, 2019

(65) Prior Publication Data
US 2019/0241844 A1    Aug. 8, 2019

(30) Foreign Application Priority Data
Feb. 7, 2018 (KR) .................. 10-2018-0015263

(51) Int. Cl.
*B08B 3/10* (2006.01)
*C11D 11/00* (2006.01)
(Continued)

(52) U.S. Cl.
CPC ............ *C11D 11/0047* (2013.01); *B08B 3/10* (2013.01); *C11D 1/12* (2013.01); *C11D 1/146* (2013.01);
(Continued)

(58) Field of Classification Search
CPC ....... C11D 11/0047; C11D 1/12; C11D 1/146; C11D 1/29; C11D 3/201; C11D 3/2017;
(Continued)

(56) References Cited

U.S. PATENT DOCUMENTS 5,641,741 A * 6/1997 Emery .................. C11D 1/02
510/457
7,607,821 B2   10/2009 Schmidt
(Continued)

FOREIGN PATENT DOCUMENTS

KR    2009-0074453 A    7/2009
KR    10-2010-0048416 A    5/2010
(Continued)

*Primary Examiner* — Sharidan Carrillo
(74) *Attorney, Agent, or Firm* — Lee IP Law, P.C.

(57) ABSTRACT

A cleaning composition, a cleaning apparatus, and a method of fabricating a semiconductor device, the cleaning composition including a surfactant; deionized water; and an organic compound, wherein the surfactant is included in the cleaning composition in a concentration of about 0.28 M to about 0.39 M or a mole fraction of about 0.01 to about 0.017, and wherein the organic compound is included in the cleaning composition in a concentration of about 7.1 M to about 7.5 M or a mole fraction of about 0.27 to about 0.35.

9 Claims, 14 Drawing Sheets

(51) Int. Cl.
*H01L 21/67* (2006.01)
*H01L 21/687* (2006.01)
*H01L 21/02* (2006.01)
*C11D 17/00* (2006.01)
*C11D 3/28* (2006.01)
*C11D 3/20* (2006.01)
*C11D 3/34* (2006.01)
*C11D 3/32* (2006.01)
*C11D 1/14* (2006.01)
*C11D 1/12* (2006.01)
*C11D 1/29* (2006.01)

(52) U.S. Cl.
CPC ............... *C11D 1/29* (2013.01); *C11D 3/201* (2013.01); *C11D 3/2017* (2013.01); *C11D 3/2044* (2013.01); *C11D 3/2096* (2013.01); *C11D 3/28* (2013.01); *C11D 3/32* (2013.01); *C11D 3/3445* (2013.01); *C11D 17/0008* (2013.01); *H01L 21/02057* (2013.01); *H01L 21/67017* (2013.01); *H01L 21/67051* (2013.01); *H01L 21/68764* (2013.01)

(58) Field of Classification Search
CPC ....... C11D 3/2044; C11D 3/2096; C11D 3/28; C11D 3/32; C11D 3/3445; C11D 17/0008; H01L 21/02057; H01L 21/67051; H01L 21/68764; B08B 3/10
See application file for complete search history.

(56) References Cited

U.S. PATENT DOCUMENTS

| | | | |
|---|---|---|---|
| 9,062,065 B2 | 6/2015 | Ahire et al. | |
| 9,080,238 B2 | 7/2015 | Wamura et al. | |
| 9,643,867 B2 | 5/2017 | Brooks et al. | |
| 2003/0060392 A1* | 3/2003 | Akkermans | C11D 11/0088 510/424 |
| 2005/0170981 A1* | 8/2005 | Mun | C11D 11/0047 510/201 |
| 2006/0128590 A1* | 6/2006 | Freer | C11D 17/0017 510/417 |
| 2011/0031430 A1 | 2/2011 | Cao et al. | |
| 2014/0371386 A1 | 12/2014 | De Vera | |
| 2015/0000704 A1* | 1/2015 | Yeh | H01L 21/67051 134/19 |
| 2016/0315019 A1 | 10/2016 | Oh et al. | |
| 2017/0008040 A1 | 1/2017 | Jeong et al. | |
| 2018/0151395 A1 | 5/2018 | Park et al. | |
| 2019/0241844 A1* | 8/2019 | Park | C11D 17/0008 |

FOREIGN PATENT DOCUMENTS

| | | |
|---|---|---|
| KR | 10-1558240 B1 | 10/2015 |
| KR | 10-2018-0059650 A | 6/2018 |

\* cited by examiner

CLEANING COMPOSITION, CLEANING APPARATUS, AND METHOD OF FABRICATING SEMICONDUCTOR DEVICE USING THE SAME

CROSS-REFERENCE TO RELATED APPLICATION

Korean Patent Application No. 10-2018-0015263, filed on Feb. 7, 2018, in the Korean Intellectual Property Office, and entitled: "Cleaning Composition, Cleaning Apparatus, and Method of Fabricating Semiconductor Device Using the Same," is incorporated by reference herein in its entirety.

BACKGROUND

1. Field

Embodiments relate to a cleaning composition, a cleaning apparatus, and a method of fabricating a semiconductor device using the same.

2. Description of the Related Art

As semiconductor devices become highly integrated, fine patterns and multilayer circuit structures may be formed.

SUMMARY

The embodiments may be realized by providing a cleaning composition including a surfactant; deionized water; and an organic compound, wherein the surfactant is included in the cleaning composition in a concentration of about 0.28 M to about 0.39 M or a mole fraction of about 0.01 to about 0.017, and wherein the organic compound is included in the cleaning composition in a concentration of about 7.1 M to about 7.5 M or a mole fraction of about 0.27 to about 0.35.

The embodiments may be realized by providing a cleaning apparatus for cleaning a substrate, the cleaning apparatus including a chuck on which the substrate is receivable; a nozzle configured to provide a cleaning liquid to the substrate; and a cleaning liquid supply configured to supply the cleaning liquid to the nozzle, and configured to generate cleaning particles by stirring the cleaning liquid, wherein the cleaning liquid supply includes an electrical conductivity meter configured to measure the electrical conductivity of the cleaning liquid, and a thermostat configured to cool the cleaning liquid when the electrical conductivity of the cleaning liquid decreases.

The embodiments may be realized by providing a method of fabricating a semiconductor device, the method including preparing a cleaning liquid; cleaning a substrate using the cleaning liquid; and drying the substrate, wherein the preparing the cleaning liquid includes providing deionized water into a chemical tank; and generating the cleaning liquid by mixing a chemical source of the cleaning liquid in the deionized water, wherein the cleaning liquid includes a surfactant, deionized water, and an organic compound, wherein the surfactant is included in the cleaning liquid in a concentration of about 0.04 M to about 0.004 M or a mole fraction of about 0.0003 to about 0.0004, and wherein the organic compound is included in the cleaning liquid in a concentration of about 0.17 M to about 0.57 M or a mole fraction of about 0.005 to about 0.008.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
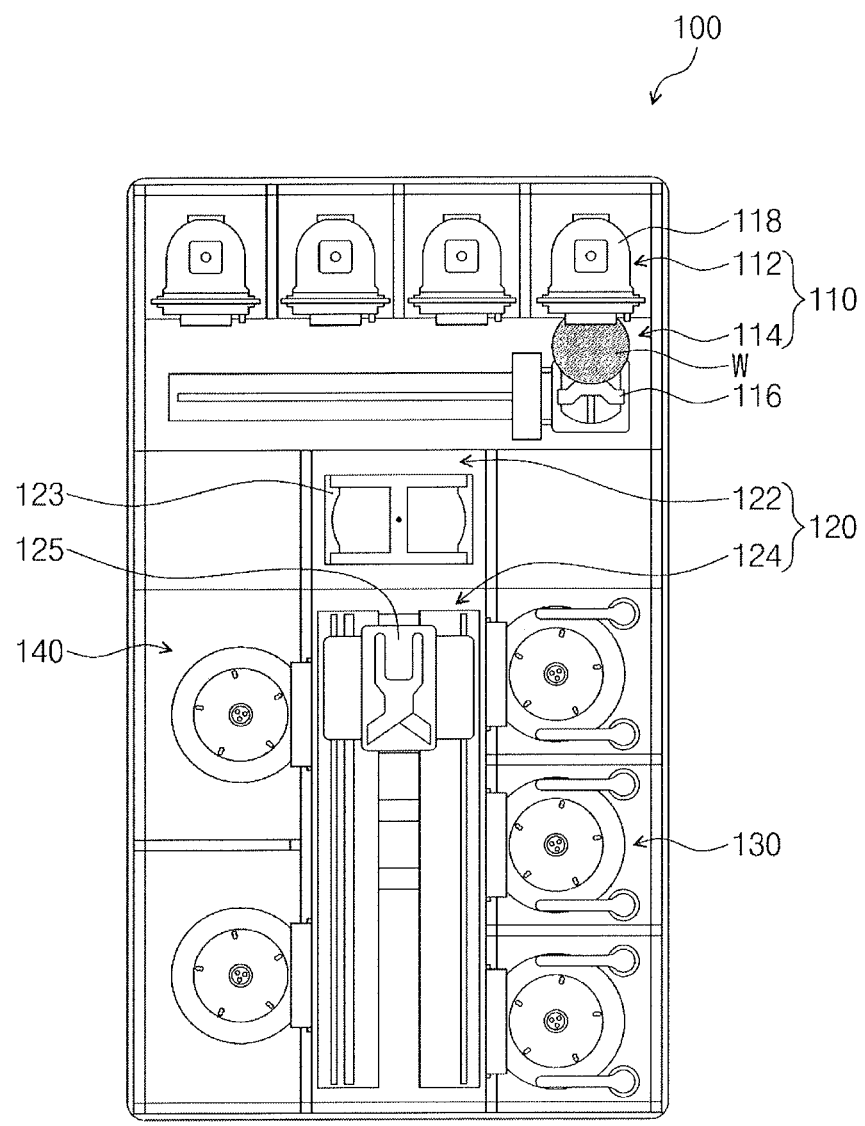
FIG. 1 illustrates a plan view of equipment for fabricating a semiconductor device according to an exemplary embodiment of the present disclosure.

FIG. 1 illustrates a plan view of equipment for fabricating a semiconductor device according to an exemplary embodiment of the present disclosure.

Referring to FIG. 1, equipment 100 for fabricating a semiconductor device may include wet cleaning equipment or wet etching equipment. In an implementation, the equipment 100 may include chemical mechanical polishing (CMP) equipment. The equipment 100 may include an index apparatus 110, a transfer apparatus 120, a cleaning apparatus 130, and a drying apparatus 140.

The index apparatus 110 may temporarily store a cassette 118. The cassette 118 may mount a substrate W thereon (e.g., the substrate W may be mountable on the cassette 118). The index apparatus 110 may include a loading port 112 and a transport frame 114. The loading port 112 may receive the cassette 118. The cassette 118 may include a front opening unified pod (FOUP). An index arm 116 in the transport frame 114 may load the substrate W from the cassette 118 and may transfer the substrate W to the transfer apparatus 120. Also, the index arm 116 may unload the substrate W in the cassette 118.

The transfer apparatus 120 may transfer the substrate W to the cleaning apparatus 130 and to the drying apparatus 140. The transfer apparatus 120 may include a buffer chamber 122 and a transfer chamber 124. The buffer chamber 122 may be disposed between the transport frame 114 and the transfer chamber 124. A buffer arm 123 in the buffer chamber 122 may receive the substrate W. The index arm 116 may provide the substrate W onto the buffer arm 123. The index arm 116 may transfer the substrate W on the buffer arm 123 to the cassette 118. A transfer arm 125 in the transfer chamber 124 may provide the substrate W on the buffer arm 123 to the cleaning apparatus 130. Also, the transfer arm 125 may transfer the substrate W from the cleaning apparatus 130 to the drying apparatus 140. Also, the transfer arm 125 may transfer the substrate W from the cleaning apparatus 130 to the buffer arm 123.

The cleaning apparatus 130 may be disposed on one side of the transfer chamber 124. The cleaning apparatus 130 may clean and/or etch the substrate W. In an implementation, the cleaning apparatus 130 may wet-clean the substrate W. In an implementation, the cleaning apparatus 130 may dry-clean the substrate W.

The drying apparatus 140 may be disposed on the other side of the transfer chamber 124. The drying apparatus 140 may dry the substrate W. For example, the drying apparatus 140 may include a supercritical processing apparatus. In an implementation, the drying apparatus 140 may include a baker and/or a heater.

In an implementation, a polishing apparatus may be provided at the end of the transfer chamber 124 to face the buffer chamber 122. The polishing apparatus may polish the substrate W. For example, the polishing apparatus may be a CMP apparatus.

Figure 2:
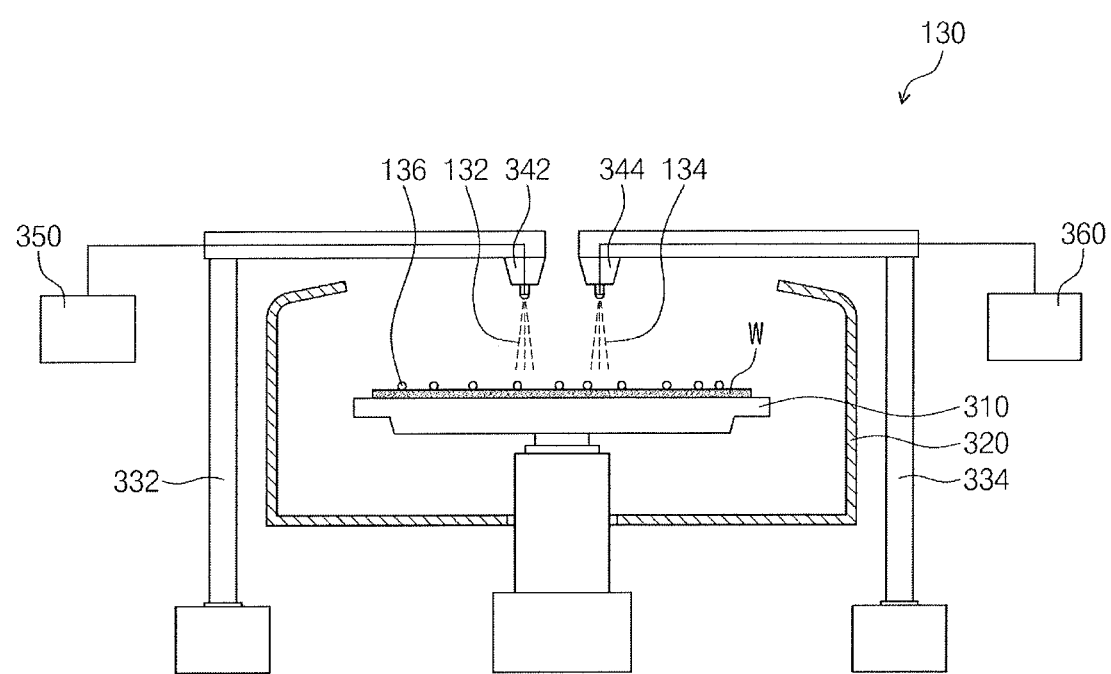
FIG. 2 illustrates a schematic view of an example of a cleaning apparatus illustrated in FIG. 1.

FIG. 2 illustrates an example of the cleaning apparatus 130 of FIG. 1.

Referring to FIG. 2, the cleaning apparatus 130 may include, e.g., a chuck 310, a pawl 320, first and second arms 332 and 334, first and second nozzles 342 and 344, a first deionized water supply 350, and a chemical solution supply 360.

The chuck 310 may receive the substrate W. The chuck 310 may rotate the substrate W. For example, the chuck 310 may rotate the substrate W at about 10 rpm to about 6,000 rpm. Accordingly, first deionized water 132 or a chemical solution 134 may be moved around on the substrate W by a centrifugal force, and as a result, the substrate W may be cleaned.

The pawl 320 may surround the substrate W. The first deionized water 132 or the chemical solution 134 may be moved in a direction from the substrate W to the pawl 320. The pawl 320 may help prevent the outflow of the first deionized water 132 or the chemical solution 134 on the rotating substrate W. The pawl 320 may release the first deionized water 132 or the chemical solution 134 below the chuck 310. The pawl 320 may help prevent contamination of the substrate W.

The first and second arms 332 and 334 may fix the first and second nozzles 342 and 344, respectively. The first nozzle 342 may be connected to a tip of the first arm 332. The second nozzle 344 may be connected to a tip of the second arm 334. The first and second arms 332 and 334 may move the first and second nozzles 342 and 344, respectively, to the center of the substrate W.

The first and second nozzles 342 and 344 may provide the first deionized water 132 and the chemical solution 134, respectively, onto the substrate W. For example, the first and second nozzles 342 and 344 may provide the first deionized water 132 and the chemical solution 134, respectively, at a pressure of about 1 atm to about 10 atm. The first deionized water 132 and the chemical solution 134 may be provided in the form of droplets or spray. The first deionized water 132 and the chemical solution 134 may be provided to the center of the substrate W. The first deionized water 132 and the chemical solution 134 may clean the substrate W from the center to the edges. The first deionized water 132 and the chemical solution 134 may help remove process particles 136 from the substrate W.

The first deionized water supply 350 may provide the first deionized water 132 to the first nozzle 342. The first deionized water 132 may be a cleaning solution and/or an etchant. For example, the first deionized water supply 350 may include a water purifier.

The chemical solution supply 360 may provide the chemical solution 134 to the second nozzle 344. The chemical solution 134 may be an etchant and/or a cleaning composition. For example, the chemical solution 134 may have a pH of about 8 or higher. If the pH of the chemical solution 134 is higher than 9, the repulsive force between the process particles 136 in the chemical solution 134 may increase. Also, if the pH of the chemical solution 134 is higher than 9, the repulsive force between the substrate W and the process particles 136 in the chemical solution 134 may increase.

For example, the chemical solution 134 may include a surfactant, second deionized water 514 (see FIG. 4), and an organic compound. The organic compound may include, e.g., isopropyl alcohol (IPA), ethyl alcohol (EtOH), methyl alcohol (MeOH), or dimethyl sulfoxide (DMOS), a solvent of dimethylformamide (DMF), a solvent of ethylene glycol (EG), a solvent of propylene glycol (PG), a solvent of tetrahydrofuran (THF), a solvent of N-methyl-2-pyrrolidone (NMP), or a solvent of N-ethyl-2-pyrrolidone (NEP). In an implementation, the organic compound may include, e.g., dimethyl sulfoxide, dimethylformamide, tetrahydrofuran, ethylene glycol, propylene glycol, or N-methyl-2-pyrrolidone. The surfactant may be an anionic surfactant. In an implementation, the surfactant may be a sulfate-based compound represented by Formula 1.

$$(R^1-O)_a-(R^2-O)_b-SO_3NH_4 \quad (1)$$

In Formula 1, a and b may each independently be, e.g., an integer of 0 to 18. In an implementation, a and b may not simultaneously be zero. $R^1$ may be, e.g., a substituted or unsubstituted alkyl group or alkylene group having 1 to 18 carbon atoms or an unsubstituted or substituted arylene group having 6 to 14 carbon atoms. In an implementation, when a is 3 or greater (e.g., 3 to 18), ($R^1$—O) may be repeated randomly or in a block form. In an implementation, when a=1, $R^1$ may have 16 carbon atoms and b=0, and the surfactant may be ammonium hexadecyl sulfate ($CH_3$($CH_2$)$_{14}$$CH_2$—O—$SO_3NH_4$. The surfactant may help enhance the efficiency of removing the process particles 136.

Figure 3:
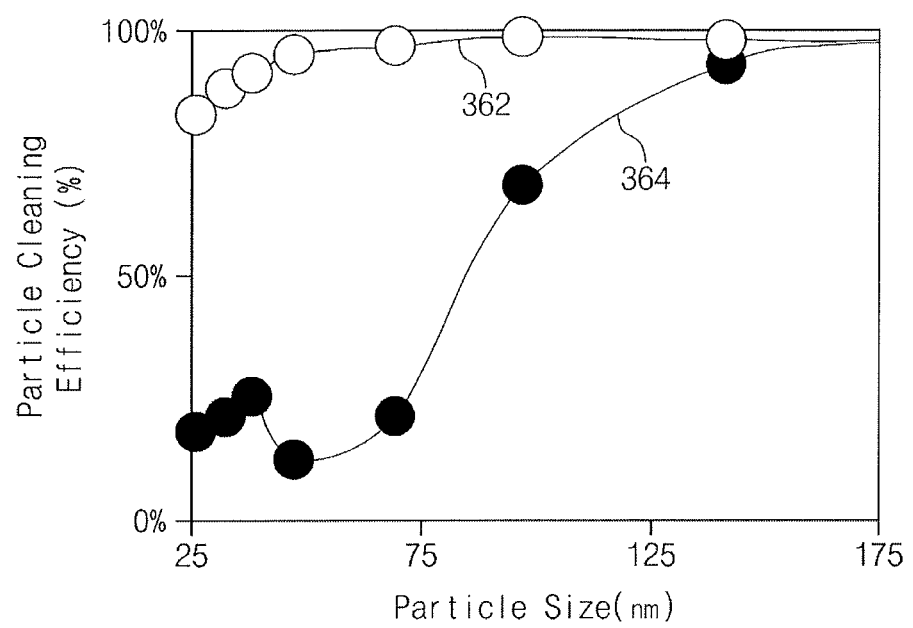
FIG. 3 illustrates a graph showing the variation of the cleaning efficiencies of a chemical solution and the Standard Clean 1 (SC-1) solution depending on the size of process particles.

FIG. 3 illustrates a graph showing the cleaning efficiencies of the chemical solution 134 according to an embodiment and the Standard Clean 1 (SC-1) solution for various sizes of process particles 136.

Referring to FIG. 3, the cleaning efficiency (362) of the chemical solution 134 may be higher than the cleaning efficiency (364) of the SC-1 solution when the process particles 136 have a size of about 100 nm or less. For example, for process particles 136 having a size of about 45 nm or less, the chemical solution 134 may have a cleaning efficiency (362) of about 87%, and the SC-1 solution may have a cleaning efficiency (364) of only about 21%. The SC-1 solution may be provided at as high a pressure as about 2 atm. Due to the high pressure of the SC-1 solution, a top surface of the substrate W could be damaged, thereby undesirably generating new process particles 136. For example, fine and/or small process particles 136 having a size of about 45 nm or less may not be easily removed. On the other hand, the chemical solution 134 according to an embodiment may be provided at a relatively low pressure, e.g., a pressure of about 1 atm or at atmospheric pressure, and the surfactant of the chemical solution 134 may absorb and remove fine process particles 136. Thus, the cleaning efficiency (362) of the chemical solution 134 may be higher than the cleaning efficiency (364) of the SC-1 solution.

Figure 4:
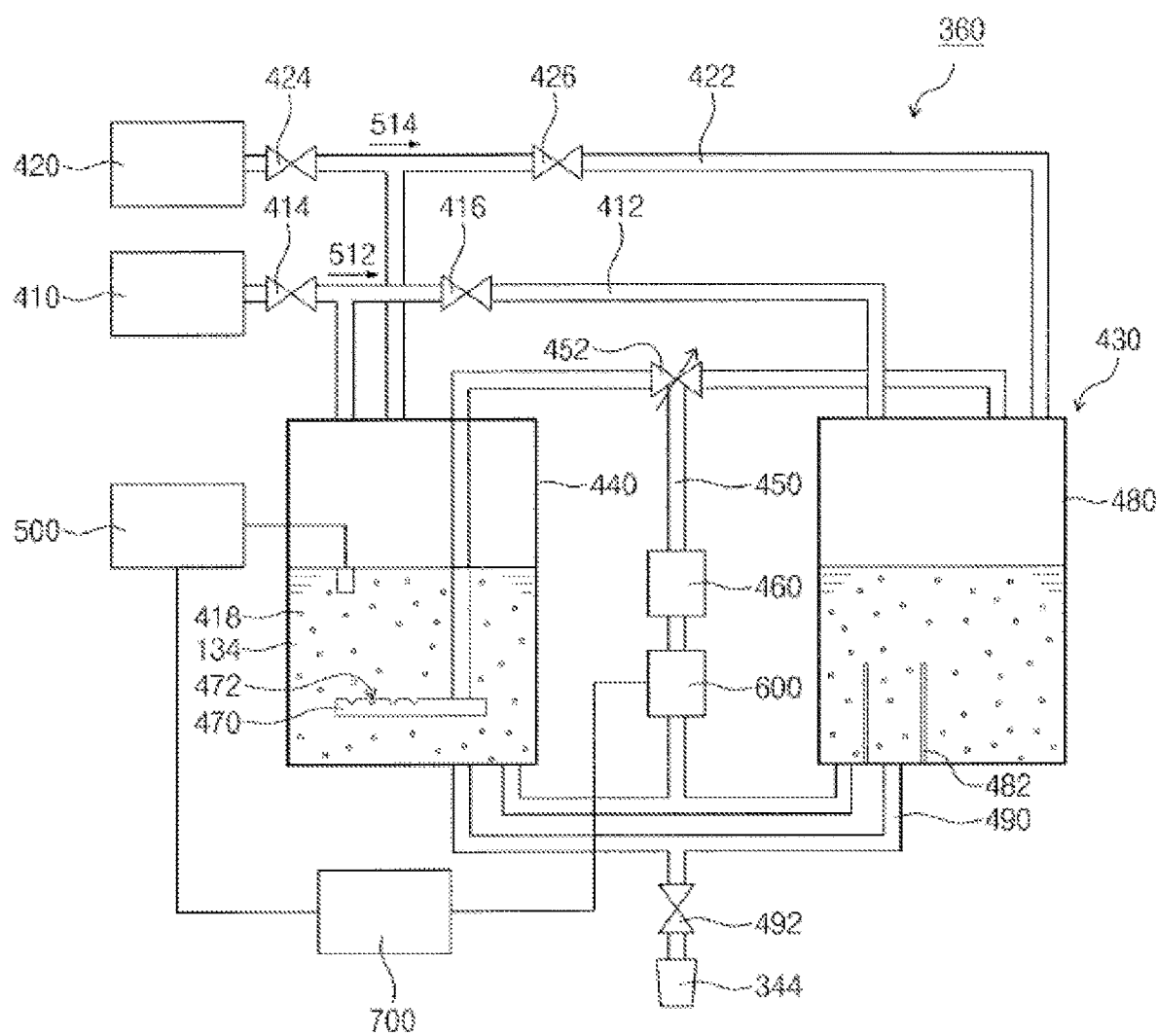
FIG. 4 illustrates a schematic view of an example of a chemical solution supply illustrated in FIG. 2.

FIG. 4 illustrates an example of the chemical solution supply 360 of FIG. 2.

Referring to FIG. 4, the chemical solution supply 360 may circulate the chemical solution 134. Also, the chemical solution supply 360 may stir and/or mix the chemical solution 134. The chemical solution supply 360 may include a source supply 410, a deionized water supply 420, and a cleaning liquid circulator 430.

The source supply 410 may store a chemical source 512. The chemical source 512 may include deionized water, the surfactant, and the organic compound. The chemical source 512 may contain about 30% of the surfactant/the organic compound and about 70% of deionized water. For example, the surfactant may have a concentration of about 0.28 M to about 0.39 M (e.g., or a mole fraction of about 0.01 to about 0.017) in the chemical source 512, and the organic compound may have a concentration of about 7.1 M to about 7.5 M (e.g., or a mole fraction of about 0.27 to about 0.35) in the chemical source 512. In an implementation, the chemical source 512 may contain about 70% of the surfactant/the organic compound and about 30% of deionized water. The chemical source 512 may be kept at ambient temperature (e.g., may be kept at a temperature of about 20° C.). The source supply 410 may be connected to the cleaning liquid circulator 430 via a first supply line 412 and first and second source valves 414 and 416.

The deionized water supply 420 may store the second deionized water 514. The second deionized water 514 may be kept at ambient temperature (e.g., may be kept a temperature of about 20° C.). The deionized water supply 420 may be connected to the cleaning liquid circulator 430 via a second supply line 422 and first and second water valves 424 and 426.

The cleaning liquid circulator 430 may generate the chemical solution 134 by mixing the chemical source 512 and the second deionized water 514. For example, the chemical source 512 may be diluted about 10 times to about 100 times with the second deionized water 514. The organic compound may have a concentration of about 0.17 M to about 0.57 M (e.g., or a mole fraction of about 0.005 to about 0.008) in the chemical solution 134. The surfactant may have a concentration of about 0.004 M to about 0.04 M (e.g., or a mole fraction of about 0.0003 to about 0.0004) in the chemical solution 134. For example, the chemical source 512 may be diluted 20 times with the second deionized water 514. In an implementation, the organic compound may have a concentration of about 0.4 M in the chemical solution 134. The surfactant may have a concentration of about 0.022 M in the chemical solution 134.

The cleaning liquid circulator 430 may generate cleaning particles 418 in the chemical solution 134 by circulating the chemical solution 134. For example, the cleaning liquid circulator 430 may generate the cleaning particles 418 in about one hour. The cleaning liquid circulator 430 may include a first chemical tank 440, a circulation line 450, a pump 460, a stirrer 470, a second chemical tank 480, a discharge line 490, an electrical conductivity meter 500, a thermostat 600, and a controller 700.

The first chemical tank 440 may stir the second deionized water 514 and the chemical source 512. The first chemical tank 440 may store the chemical solution 134.

The circulation line 450 may branch off from the bottom of the first chemical tank 440 and may be connected to the top of the first chemical tank 440. Similarly, the circulation line 450 may branch off from the bottom of the second chemical tank 480 and may be connected to the top of the second chemical tank 480. The first chemical tank 440 may be connected to the second chemical tank 480 via the circulation line 450. The chemical solution 134 may be circulated from lower parts of the first and second chemical tanks 440 and 480 to upper parts of the first and second chemical tanks 440 and 480 along the circulation line 450. For example, the circulation line 450 may have a length of about 15 m or more from the bottom to the top of the first chemical tank 440. The circulation valve 452 may be coupled to the circulation line 450 between the tops of the first and second chemical tanks 440 and 480 and the pump 460. The circulation valve 452 may control the circulation of the chemical solution 134 in the circulation line 450. For example, the circulation valve 452 may be a three-way valve. The circulation valve 452 may provide the chemical solution 134 in the circulation line 45 to at least one of the first and second chemical tanks 440 and 480 in accordance with a control signal from the controller 700.

The pump 460 may be disposed between the first and second chemical tanks 440 and 480. The pump 460 may be connected to the circulation line 450. The pump 460 may generate circulation pressure and/or pumping pressure for the chemical solution 134. The chemical solution 134 may be circulated at a flow rate proportional to the circulation pressure and/or pumping pressure generated by the pump 460. For example, the pump 460 may circulate the chemical solution 134 with a pumping pressure of about 200 KPa or more. The circulation valve 452 may divide and/or distribute the pumping pressure for the chemical solution 134.

The stirrer 470 may be connected to an end of the circulation line 450 in the first chemical tank 440. The stirrer 470 may be disposed adjacent to the bottom of the first chemical tank 440. The stirrer 470 may extend in parallel to the bottom of the first chemical tank 440. For example, the stirrer 470 may include a porous tube. For example, the stirrer 470 may include perforated holes 472. The perforated holes 472 may be disposed to face the opposite side to the bottom of the first chemical tank 440, e.g., to face the top of the first chemical tank 440. The perforated holes 472 may generate a swirling flow of the chemical solution 134 and may thus efficiently stir the chemical solution 134.

The stirrer 470 may generate cleaning particles 418 and/or absorption particles in the chemical solution 134. The cleaning particles 418 may be different from typical micelles. Generally, micelles may be generated when the critical micelle concentration is reached. On the other hand, the cleaning particles 418 may be generated by reducing the solubility of the chemical solution 134. For example, the cleaning particles 418 of the chemical solution 134 may be generated when the saturation concentration of the chemical solution 134 is reached. As the chemical solution 134 is stirred, the distribution of the cleaning particles 418 may change.

The second chemical tank 480 may store the chemical solution 134 in reserve. The chemical solution 134 in the second chemical tank 480 may be circulated by the circulation line 450 and the pump 460. The second chemical tank 480 may include baffles 482. The baffles 482 may be disposed in the second chemical tank 480 adjacent to the circulation line 450 and the discharge line 490. The baffles 482 may generate a swirling flow of the chemical solution 134 in the second chemical tank 480 and may thus efficiently stir the chemical solution 134.

The discharge line 490 may connect the first and second chemical tanks 440 and 480 to the second nozzle 344. The discharge valve 492 may be coupled to the discharge line 490 between the first and second chemical tanks 440 and 480 and the second nozzle 344. The discharge valve 492 may control the supply of the chemical solution 134.

The electrical conductivity meter 500 may be provided in or coupled with the first chemical tank 440. The electrical conductivity meter 500 may measure the electrical conductivity of the chemical solution 134.

The thermostat 600 may be coupled to the circulation line 450. The thermostat 600 may be coupled to the first and second chemical tanks 440 and 480. The thermostat 600 may control the temperature of the chemical solution 134. For example, the thermostat 600 may heat and/or cool the chemical solution 134.

The controller 700 may be connected to the electrical conductivity meter 500 and the thermostat 600. The controller 700 may control the generation and/or the growth of the cleaning particles 418 using electrical conductivity. Also, the controller 700 may control the opening and closing of the pump 460, the first and second water valves 424, the first and second source valves 414 and 416, and the circulation valve 452.

Figure 5A:
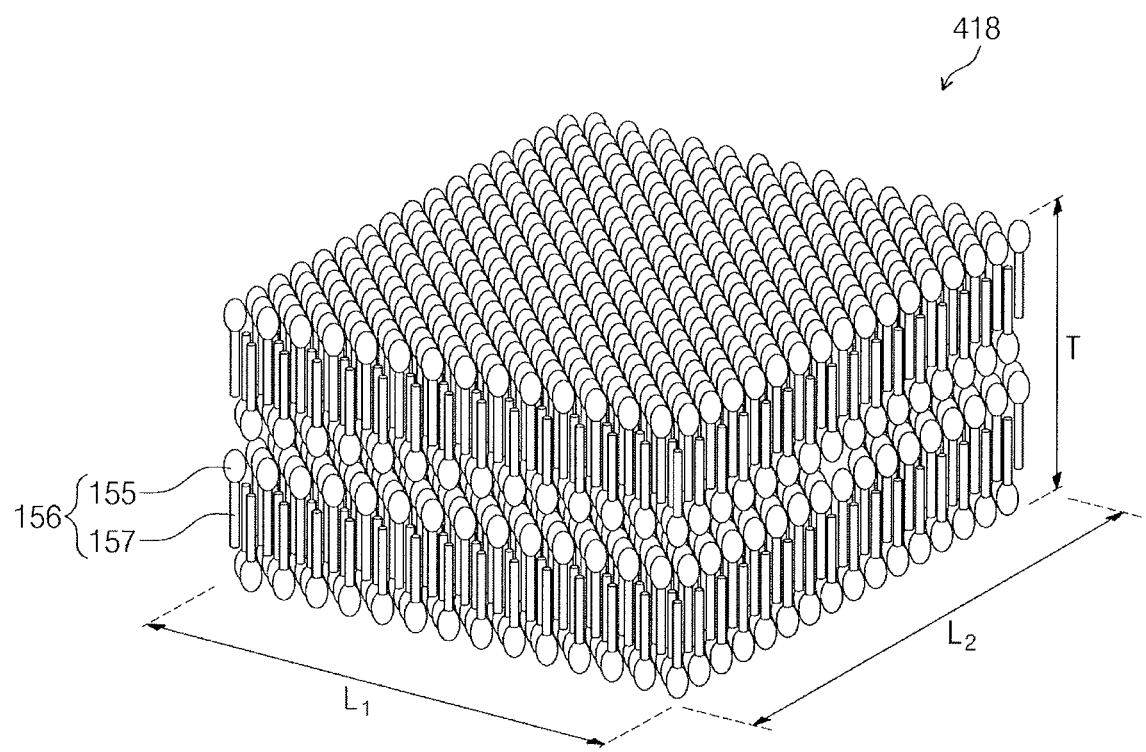
FIGS. 5A and 5B illustrate perspective views of examples of cleaning particles of FIG. 4.
Figure 5B:
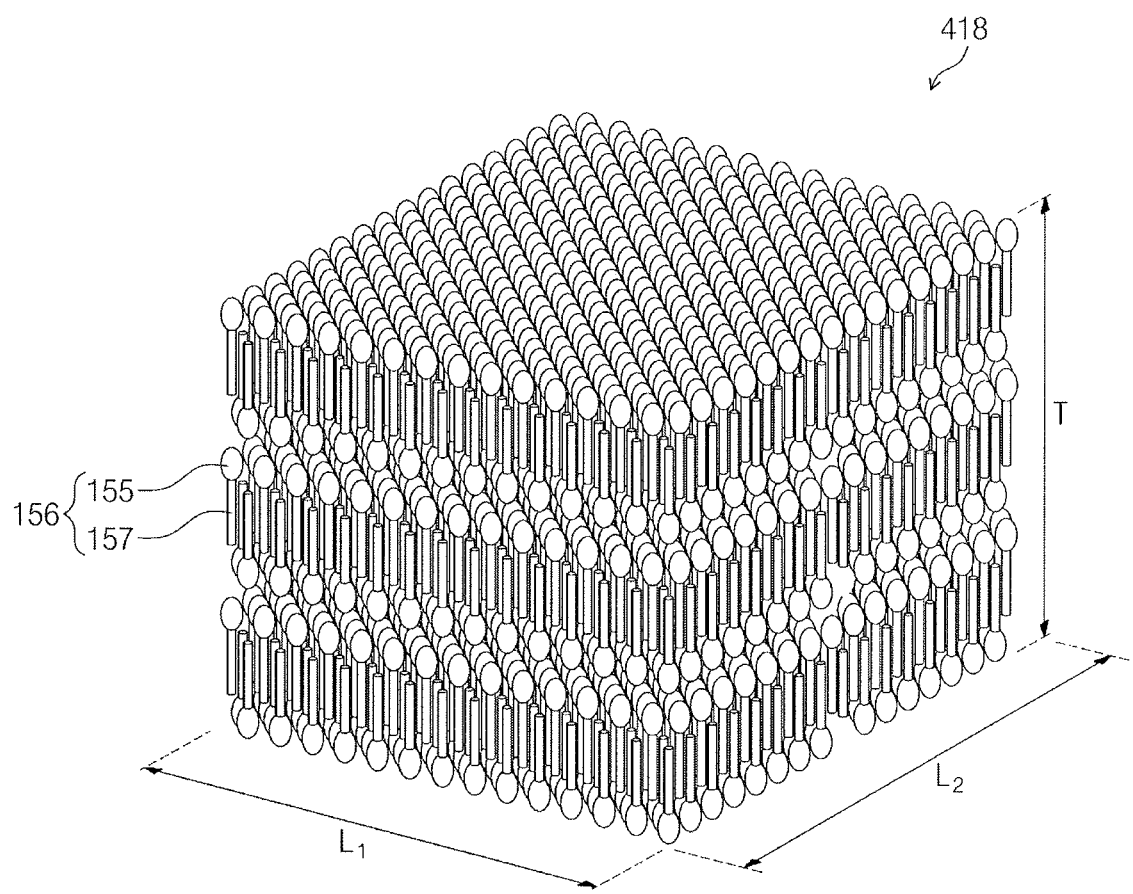

FIGS. 5A and 5B illustrate perspective views of examples of the cleaning particles 418 of FIG. 4.

Referring to FIGS. 5A and 5B, each of the cleaning particles 418 may be formed by self-assembly of surfactant molecules 156. The surfactant molecules 156 may be aligned in one direction in each of the cleaning particles 418. Each of the surfactant molecules 156 may include a hydrophobic unit 155 and a hydrophilic unit 157. The hydrophobic unit 155 may include an oxygen ion ($O^{2+}$) or an oxygen ion conjugate. The hydrophilic unit 157 may include a sulfur trioxide ion ($SO_3^-$) or a sulfur trioxide ion conjugate. The hydrophobic unit 155 may be bonded to the hydrophilic unit 157 in one direction.

Referring to FIG. 5A, the cleaning particles 418 may be hexahedral, whereas typical micelles are spherical. For example, the cleaning particles 418 may have horizontal and vertical lengths $L_1$ and $L_2$ of about 20 μm to about 200 μm and a height T (e.g., thickness) of about 1 μm to about 10 μm. The height T of the cleaning particles 418 may be defined along a direction in which the surfactant molecules 156 are aligned or extend.

Referring to FIG. 5B, the cleaning particles 418 may have a hexahedral or cubic shape. For example, the horizontal length $L_1$, the vertical length $L_2$, and the height T of the cleaning particles 418 may all be about 20 μm to about 200 μm. The horizontal length $L_1$, the vertical length $L_2$, and the height T of the cleaning particles 418 will hereinafter be described as being the average horizontal length, the average vertical length, and the average height, respectively, of the cleaning particles 418.

Figure 6:
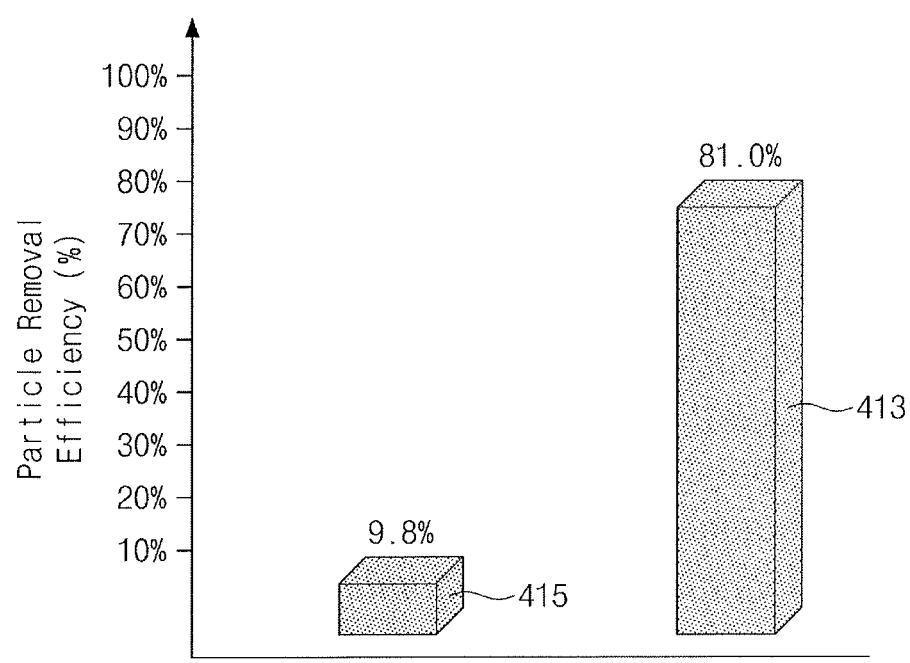
FIG. 6 illustrates a graph showing shows the process particle removal efficiency of a chemical solution having cleaning particles and the process particle removal efficiency of a chemical solution not having cleaning particles.

FIG. 6 illustrates a graph showing the particle removal efficiency (413) of the chemical solution 134 having the cleaning particles 418 and the particle removal efficiency (415) of the chemical solution 134 not having the cleaning particles 418.

Referring to FIG. 6, the particle removal efficiency (413) of the chemical solution 134 having the cleaning particles 418 may be higher than the particle removal efficiency (415) of the chemical solution 134 not having the cleaning particles 418 because the cleaning particles 418 may absorb and remove process particles 136. For example, the chemical solution 134 having the cleaning particles 418 may have a particle removal efficiency of about 81.0%, and the chemical solution 134 not having the cleaning particles 418 may have a particle removal efficiency of about 9.8%.

Figure 7:
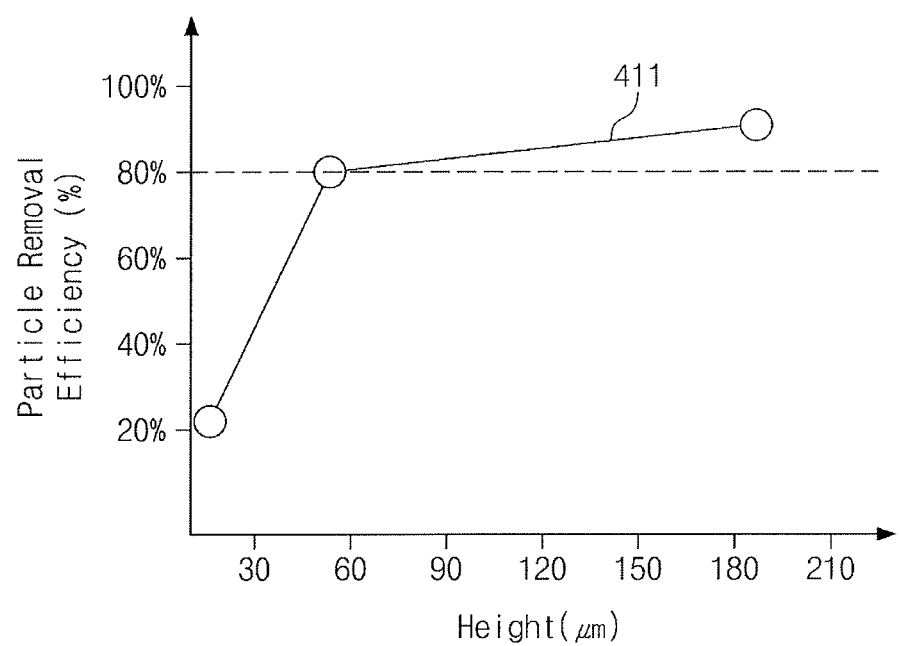
FIG. 7 illustrates a graph showing the variation of the primary particle removal efficiency of cleaning particles for process particles depending on the height of the cleaning particles.

FIG. 7 illustrates a graph showing the variation of the primary particle removal efficiency (411) of the cleaning particle 418 for the process particles 136 depending on the height T of the cleaning particles 418.

Referring to FIG. 7, as the size of the cleaning particles 418 increases, the primary particle removal efficiency (411) of the cleaning particles 418 for the process particles 136 may increase. For example, cleaning particles 418 having a height T of about 1 μm may have a primary particle removal efficiency (411) of about 20%, cleaning particles 418 having a height T of about 50 μm may have a particle removal efficiency (411) of about 80%, and cleaning particles 418 having a height T of about 100 μm may have a primary particle removal efficiency (411) of about 90%. If the height T of the cleaning particles 418 were to be greater than the horizontal and vertical lengths $L_1$ and $L_2$ of the cleaning particles 418, the cleaning particles 418 could damage the substrate W. For example, if the cleaning particles 418 were to have a height T of about 200 μm or greater, the substrate W could be damaged by the cleaning particles 418. As a result, the yield of the substrate W could decrease.

As the speed at which the chemical solution 134 is stirred increases, the primary particle removal efficiency 411 of the cleaning particles 418 for the process particles 136 may increase. The speed at which the chemical solution 134 is stirred may be defined as the flow rate per minute of the chemical solution 134 passing through the circulation line 450. For example, when the chemical solution 134 is stirred at a speed of 20 liters per minutes (lpm), the primary particle removal efficiency (411) of the cleaning particles 418 for the process particles 136 may be about 60% to about 80%. The cleaning particles 418 may be formed as hexahedrons having a height T of about 1 μm to about 10 μm. When the chemical solution 134 is stirred at a speed of less than 20 lpm, the primary particle removal efficiency (411) of the cleaning particles 418 for the process particles 136 may be about 60% or lower. When the chemical solution 134 is not stirred, the cleaning particles 418 may be hardly generated.

Figure 8:
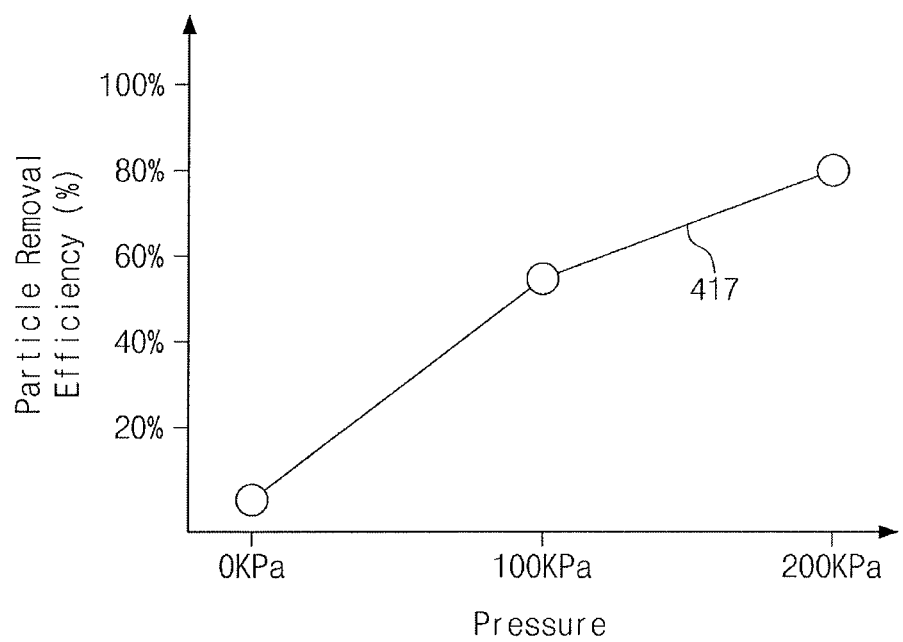
FIG. 8 illustrates a graph showing the variation of the secondary particle removal efficiency of cleaning particles for process particles depending on the pressure of a chemical solution in a circulation line and a pump of FIG. 4.

FIG. 8 illustrates the variation of the secondary particle removal efficiency (417), for the process particles 136, of the chemical solution 134 in the circulation line 450 and the pump 460 depending on the pressure of the chemical solution 134.

Referring to FIG. 8, the secondary particle removal efficiency (417) of the chemical solution 134 for the process particles 136 may be proportional to the pressure of the chemical solution 134 (e.g., the pressure at which the chemical solution is pumped). As the pressure of the chemical solution 134 increases, the speed at which the chemical solution 134 is stirred increases, and as a result, the height T of the cleaning particles 418 may be increased to about 1 μm to about 10 μm. Thus, as the pressure of the chemical solution 134 increases, the secondary particle removal efficiency (417) of the chemical solution 134 for the process particles 136 may increase. For example, when the pressure of the chemical solution 134 is 0 KPa, the secondary particle removal efficiency (417) of the chemical solution 134 for the process particles 136 may be about 20% or lower. When the pressure of the chemical solution 134 is 100 KPa, the secondary particle removal efficiency (417) of the chemical solution 134 for the process particles 136 may be increased to about 60% or higher.

A method of fabricating a semiconductor device using the equipment 100 will hereinafter be described.

Figure 9:
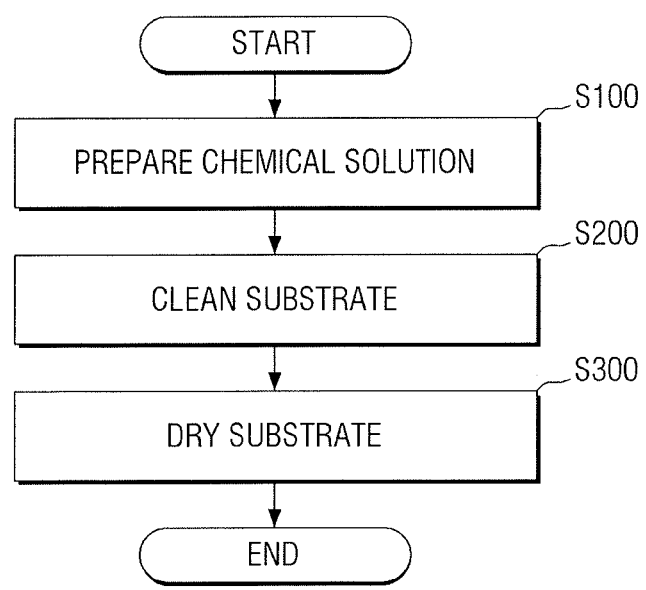
FIG. 9 illustrates a flowchart of a method of fabricating a semiconductor device using the equipment of FIG. 1.

FIG. 9 illustrates a flowchart of a method of fabricating a semiconductor device using the equipment 100.

Referring to FIG. 9, the method of fabricating a semiconductor device may include a cleaning method. The method of fabricating a semiconductor device may include the steps of preparing a chemical solution 134 (S100), cleaning a substrate W (S200), and drying the substrate W (S300).

The chemical solution supply 360 of the cleaning apparatus 130 may prepare the chemical solution 134 (S100). The step of preparing the chemical solution 134 (S100) may include the step of preparing a cleaning liquid.

Figure 10:
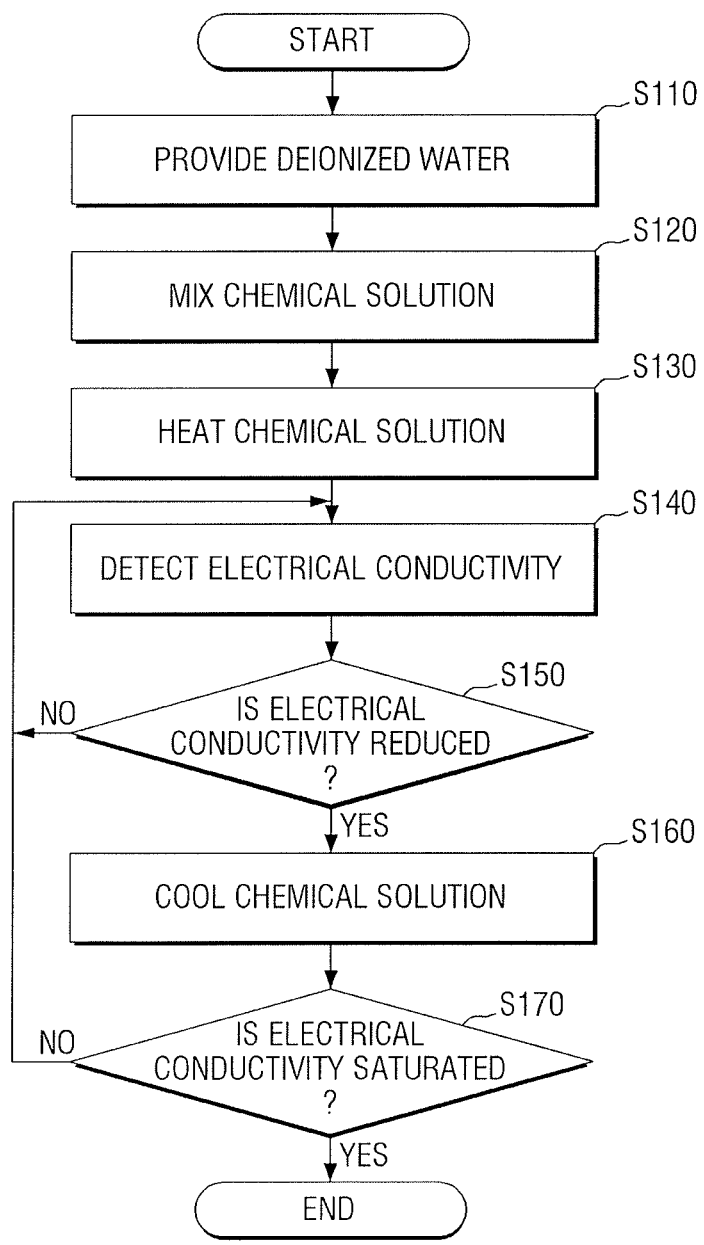
FIG. 10 illustrates a flowchart of the step of preparing a chemical solution of FIG. 9.

FIG. 10 illustrates a flowchart of the step of preparing the chemical solution 134 of FIG. 9.

Referring to FIG. 10, the step of preparing the chemical solution 134 (S100) may include the steps of providing deionized water (S110), mixing a chemical source 512 (S120), heating the chemical solution 134 (S130), detecting the electrical conductivity of the chemical solution 134 (S140), and determining whether the electrical conductivity of the chemical solution 134 decreases (S150), cooling the chemical solution 134 (S160), and determining whether the electrical conductivity of the chemical solution 134 is saturated (S170).

The deionized water supply 420 may provide deionized water 514 into the first chemical tank 440 (S110). The first water valve 424 or the second water valve 426 may be opened.

The source supply 410 may provide the chemical source 512 into the first chemical tank 440 and may mix the chemical source 512 and the deionized water 514 (S120). When the first and second water valves 424 and 426 are closed, the first or second source valve 414 or 416 may be opened. The chemical source 512 may be diluted about 10 times to about 100 times with the deionized water 514. For example, the chemical source 512 may be diluted about 10 times to about 20 times with the deionized water 514.

Figure 11:
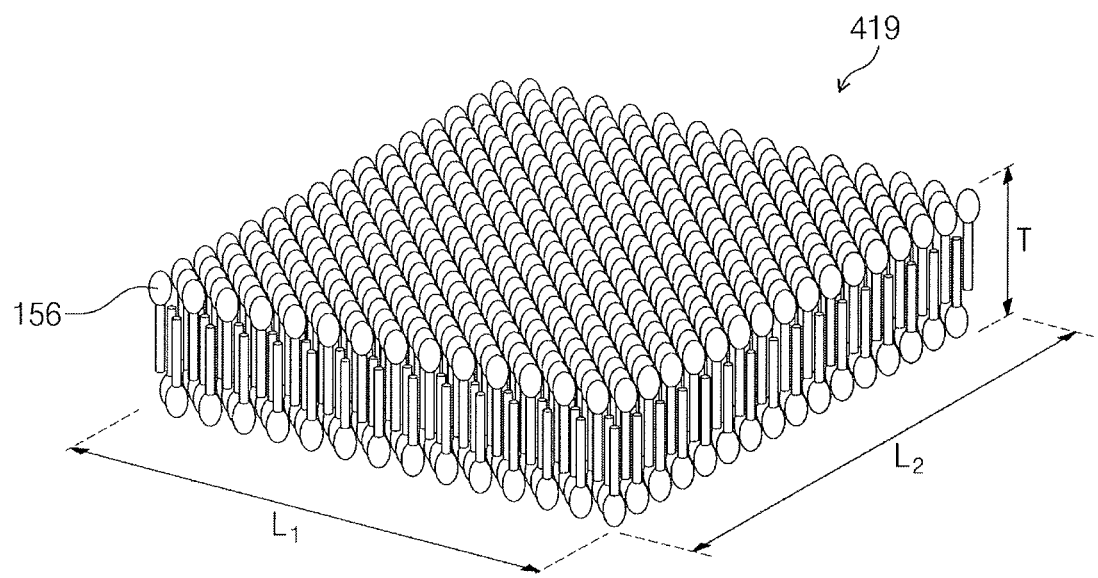
FIG. 11 illustrates as perspective view of seeds of cleaning particles of FIG. 4

FIG. 11 illustrates a perspective view of seeds 419 of the cleaning particles 418 of FIG. 4.

Referring to FIGS. 10 and 11, the thermostat 600 may generate the seeds 419 of the cleaning particles 418 in the chemical solution 134 (S130) by heating the chemical solution 134. By heating the chemical solution 134 to a first temperature (e.g., a temperature of about 26° C.), which is higher than ambient temperature (e.g., a temperature of about 20° C.), for about ten minutes, the seeds 419, which may be plate-shaped, may be generated in the chemical solution 134. The horizontal and vertical lengths of the seeds 419 may be greater than the height of the seeds 419. The horizontal and vertical lengths of the seeds 419 may be about 20 µm to about 200 µm, and the height of the seeds 419 may be about 1 µm or less. The height of the seeds 419 may not be defined. In an implementation, the horizontal and vertical lengths and the height of the seeds 419 may all be about 1 µm or less.

Referring to FIG. 10, the electrical conductivity meter 500 may detect the electrical conductivity of the chemical solution 134 (S140). For example, the electrical conductivity meter 500 may detect the electrical conductivity of the chemical solution 134 for about one to ten minutes. The electrical conductivity of the chemical solution 134 may be determined depending on the state of bonding between the surfactant molecules 156 in the chemical solution 134 or between the hydrophobic units 155 and the hydrophilic units 157.

The controller 700 may determine whether the electrical conductivity of the chemical solution 134 decreases (S150) (e.g., has decreased). For example, as the surfactant molecules 156 are agglomerated, the electrical conductivity of the chemical solution 134 may decrease. When the hydrophobic units 155 and the hydrophilic units 157 are yet to be bonded, the electrical conductivity of the chemical solution 134 may be about 500 µs/cm or higher. Once the hydrophobic units 155 and the hydrophilic units 157 are or have been bonded, the electrical conductivity of the chemical solution 134 may be about 500 µs/cm or lower (e.g., lower than the initial about 500 µs/cm or higher). Thus, when the seeds 419 are generated in the chemical solution 134, the electrical conductivity of the chemical solution 134 may decrease. For example, if the electrical conductivity of the chemical solution 134 decreases by about 2%, the controller 700 may determine that the seeds 419 have been generated in the chemical solution 134.

If a determination is made that the seeds 419 have been generated in the chemical solution 134, the thermostat 600 may grow (e.g., may facilitate or otherwise provide the impetus for growing) the cleaning particles 418 from the seeds 419 by cooling the chemical solution 134. A height T of the cleaning particles 418 may be greater than the height of the seeds 419. The cleaning particles 418 may have greater horizontal and vertical lengths $L_1$ and $L_2$ and a greater height T than the seeds 419. The horizontal and vertical lengths $L_1$ and $L_2$ of the cleaning particles 418, which are hexahedral, may be about 20 µm to about 200 µm, and the height T of the cleaning particles 418 may be about 1 µm to about 10 µm. For example, the horizontal and vertical lengths $L_1$ and $L_2$ of the cleaning particles 418 may be about 30 µm, and the height T of the cleaning particles 418 may be about 5 µm. In an implementation, the cleaning particles 418 may be cubic, in which case, the height T of the cleaning particles 418 may be the same as the horizontal and vertical lengths $L_1$ and $L_2$ of the cleaning particles 418.

Figure 12:
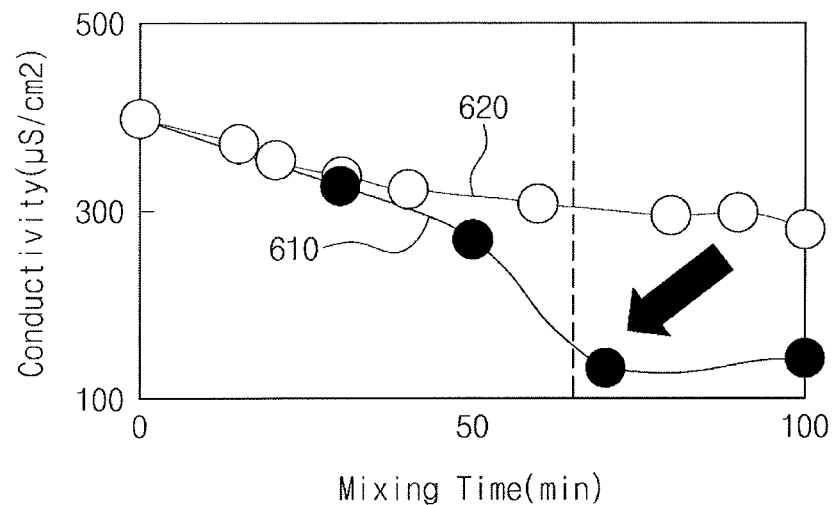
FIG. 12 illustrates a graph showing the electrical conductivity of a chemical solution at a second temperature and the electrical conductivity of the chemical solution at ambient temperature.

FIG. 12 illustrates a graph showing the electrical conductivity (610) of the chemical solution 134 at a second temperature and the electrical conductivity (620) of the chemical solution 134 at ambient temperature.

Referring to FIG. 12, the electrical conductivity (610) of the chemical solution 134 at a second temperature (e.g., a temperature of about 18° C.) may decrease more rapidly than the electrical conductivity (620) of the chemical solution 134 at ambient temperature (e.g., a temperature of about 20° C.). Once the chemical solution 134 is cooled, the cleaning particles 418 may be rapidly grown from the seeds 419. If the chemical solution 134 were to be maintained at the first temperature of, e.g., 26° C., for about two hours, the seeds 419 may not be able to be grown into the cleaning particles 418.

Referring again to FIG. 10, the controller 700 may determine whether the electrical conductivity of the chemical solution 134 is saturated (S170) (e.g., whether the electrical conductivity of the chemical solution 134 will not go any lower). If the electrical conductivity of the chemical solution 134 is not saturated, the controller 700 may perform S140, S150, S160, and S170 again. For example, the thermostat 600 may cool the chemical solution 134 below the second temperature.

On the other hand, if the electrical conductivity of the chemical solution 134 is saturated, the controller 700 may determine that the cleaning particles 418 have been generated. Once the electrical conductivity of the chemical solution 134 is saturated, the cleaning particles 418 may become hexahedral or cubic in shape. Then, the preparation of the chemical solution 134 is complete. Thereafter, the chemical solution 134 may be circulated in the cleaning liquid circulation portion 430.

Figure 13:
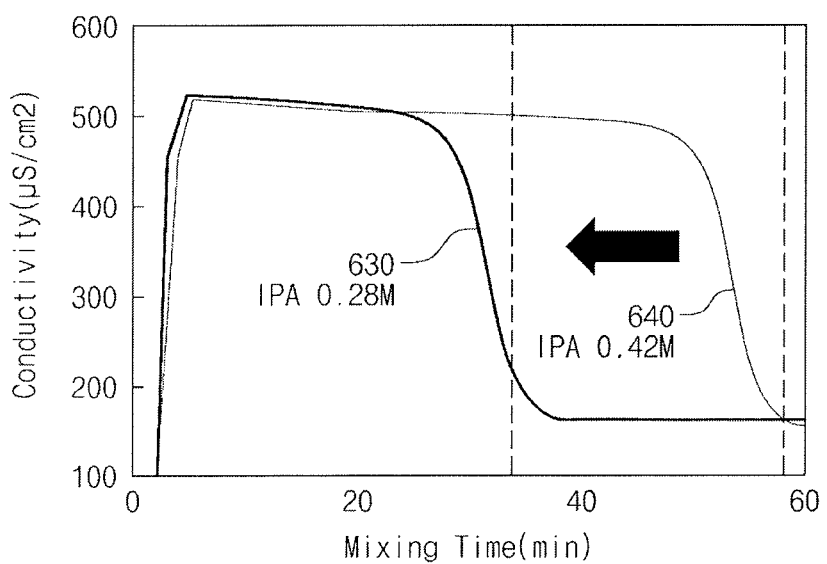
FIG. 13 illustrates a graph showing the variation of the electrical conductivity of a chemical solution depending on the concentration of an organic compound in the chemical solution.

FIG. 13 illustrates a graph showing the variation of the electrical conductivity of the chemical solution 134 depending on the concentration of an organic compound in the chemical solution 134.

Referring to FIG. 13, when the concentration of the organic compound in the chemical solution 134 is about 0.28 M to about 0.42 M, the electrical conductivity of the chemical solution 134 may be saturated within about one hour. For example, the electrical conductivity of the chemical solution 134 having an IPA concentration of about 0.28 M may be saturated within about 40 minutes. If the concentration of the organic compound in the chemical solution 134 were to be lower than about 0.28 M, the cleaning particles 418 or the seeds 419 may not be generated. For example, if the concentration of the organic compound in the chemical solution 134 were to be too low, the cleaning particles 418 may not be formed to a predetermined height T within about one hour. The electrical conductivity (640) of the chemical solution 134 having an IPA concentration of about 0.42 M may be saturated within about 60 minutes. If the concentration of the organic compound in the chemical solution 134 were to be higher than about 0.42 M, the cleaning particles 418 or the seeds 419 may not be generated because the concentration of the organic compound in the chemical solution 134 is high.

Figure 14:
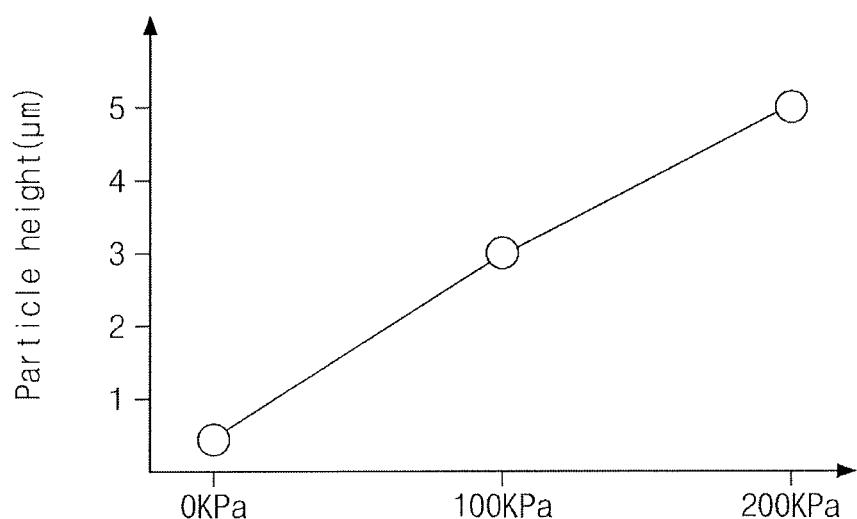
FIG. 14 illustrates a graph showing the variation of the height of cleaning particles depending on the pressure of a chemical solution in the circulation line and the pump of FIG. 4.

FIG. 14 illustrates a graph showing the variation of the height T of the cleaning particles 418 depending on the pressure of the chemical solution 134 in the circulation line 450 and the pump 460 of FIG. 4.

Referring to FIG. 14, the height T of the cleaning particles 418 may be proportional to the pressure of the chemical solution 134. For example, when the pressure of the chemical solution 134 is 0 KPa, the cleaning particles 418 may have a height T of about 1 μm or less and may have horizontal and vertical lengths $L_1$ and $L_2$ of about 1 μm. In an implementation, the cleaning particles 418 may have horizontal and vertical lengths $L_1$ and $L_2$ of about 26 μm. When the pressure of the chemical solution 134 is 100 KPa, the cleaning particles 418 may have a height T of about 3 μm and horizontal and vertical lengths $L_1$ and $L_2$ of about 10 μm. When the pressure of the chemical solution 134 is 200 KPa, the cleaning particles 418 may have a height T of about 5 μm. When the pressure of the chemical solution 134 is 200 KPa, the cleaning particles 418 may have a hexahedral shape.

Referring again to FIG. 9, the cleaning apparatus 130 may clean the substrate W with the chemical solution 134 (S200). The substrate W may be cleaned with a particle removal efficiency of about 80% or higher.

The drying apparatus 140 may dry the chemical solution 134 (S300). The first deionized water 132 and/or the chemical solution 134 may be removed from the substrate W.

By way of summation and review, a cleaning process may remove process particles that can contaminate fine patterns. The Standard Clean 1 (SC-1) solution is widely used as an etchant in a cleaning process. The SC-1 solution may contain, e.g., ammonia water and hydrogen peroxide. The SC-1 solution may remove process particles by providing a repulsive force after surface etching. Due to surface etching, the SC-1 solution may result in membrane loss.

The embodiments may provide a cleaning composition and apparatus capable of rinsing off fine process particles with ease and a method of fabricating a semiconductor device using the same.

According to the aforementioned and other exemplary embodiments of the present disclosure, a cleaning composition comprising a surfactant of ammonium hexadecyl sulfate with cleaning particles may be provided. The cleaning particles may absorb and remove fine process particles from a substrate. The cleaning composition may provide excellent cleaning power for removing fine process particles, in view of the Standard Clean 1 (SC-1) solution.

The embodiments may provide a cleaning composition and cleaning apparatus for removing process particles and a method of fabricating a semiconductor device using the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of cleaning a substrate, the method comprising:
   preparing a cleaning liquid that includes a surfactant, deionized water, and an organic compound;
   cleaning a substrate using the cleaning liquid; and
   drying the substrate,
   wherein the preparing the cleaning liquid includes:
      providing the deionized water into a chemical tank;
      generating the cleaning liquid by mixing the surfactant and the organic compound in the deionized water;
      generating plate-shaped seeds of cleaning particles of aligned molecules of the surfactant by heating the cleaning liquid to a first temperature,
      detecting an electrical conductivity of the cleaning liquid; and
      determining whether the seeds have been generated based on the detected electrical conductivity of the cleaning liquid,
   wherein the surfactant is included in the cleaning liquid in a concentration of about 0.04 M to about 0.004 M or a mole fraction of about 0.0003 to about 0.0004,
   wherein the organic compound is included in the cleaning liquid in a concentration of about 0.28 M to about 0.42 M,
   wherein the surfactant is represented by the following Formula 1':

$(R^1-O)_a-SO_3NH_4$           (1')

wherein, in Formula 1',
   a is an integer of 1 to 18,
   $R^1$ is a substituted or unsubstituted alkyl group having 1 to 18 carbon atoms, a substituted or unsubstituted alkylene group having 1 to 18 carbon atoms, or a substituted or unsubstituted arylene group having 6 to 14 carbon atoms, and
   when a is 3 to 18, ($R^1$—O) is repeated randomly or in a block form.

2. The method as claimed in claim 1, wherein the first temperature is about 26° C.

3. The method as claimed in claim 1, wherein determining whether the seeds have been generated includes determining whether the electrical conductivity of the cleaning liquid has decreased.

4. The method as claimed in claim 3, wherein the seeds have a thickness of 1 µm or less.

5. The method as claimed in claim 3, wherein preparing the cleaning liquid further includes growing the cleaning particles from the seeds by cooling the cleaning liquid to a second temperature, the second temperature being lower than the first temperature, once the seeds have been generated.

6. The method as claimed in claim 5, wherein the second temperature is about 18° C.

7. The method as claimed in claim 5, wherein:
preparing the cleaning liquid further includes determining whether the electrical conductivity of the cleaning liquid is saturated, and
when the electrical conductivity of the cleaning liquid is saturated, the cleaning particles have a hexahedral or cubic shape.

8. The method as claimed in claim 5, wherein the cleaning particles have horizontal and vertical lengths of about 20 µm to about 200 µm and a thickness of about 1 µm to about 10 µm.

9. The method as claimed in claim 5, wherein the surfactant represented by Formula 1' is ammonium hexadecyl sulfate.

\* \* \* \* \*